(12) United States Patent
Yeo et al.

(10) Patent No.: US 7,214,991 B2
(45) Date of Patent: May 8, 2007

(54) CMOS INVERTERS CONFIGURED USING MULTIPLE-GATE TRANSISTORS

(75) Inventors: Yee-Chia Yeo, Hsinchu (TW); Fu-Liang Yang, Hsin-Chu (TW); Chenming Hu, Hsinchu (TW)

(73) Assignee: Taiwan Semiconductor Manufacturing Co., Ltd.

( * ) Notice: Subject to any disclaimer, the term of this patent is extended or adjusted under 35 U.S.C. 154(b) by 40 days.

(21) Appl. No.: 10/313,887

(22) Filed: Dec. 6, 2002

(65) Prior Publication Data

US 2004/0110331 A1 Jun. 10, 2004

(51) Int. Cl.
*H01L 29/76* (2006.01)

(52) U.S. Cl. .................... 257/401; 257/331

(58) Field of Classification Search ........... 257/327, 257/329, 331, 369, 401, E21.442, E29.275, 257/E29.298, E29.299; 438/157–158, 154, 438/176, 199, 206, 212, 283
See application file for complete search history.

(56) References Cited

U.S. PATENT DOCUMENTS 5,464,783 A * 11/1995 Kim et al. ................ 438/591
6,475,890 B1 * 11/2002 Yu ........................... 438/574
6,534,807 B2 * 3/2003 Mandelman et al. ....... 257/272
6,617,210 B1 * 9/2003 Chau et al. ................ 438/240
6,858,478 B2 * 2/2005 Chau et al. ................ 438/149

OTHER PUBLICATIONS

Tang et al. ("FinFET—A quasi-Planar Double Gate MOSFET", 2001 IEEE International Solid State Circuits Conference, (pp. 118-119 and 437).*
Yang et al. (VLSI Technology, 2002. Digest of Technical Papers. 2002 Symposium on, Jun. 11-13, 2002, pp. 104-105).*
S.Wolf et al. (Silicon Processing for the VLSI Era; vol. 2-Chapter 6, CMOS Process Integration, p. 369).*

* cited by examiner

*Primary Examiner*—David Vu
(74) *Attorney, Agent, or Firm*—Tung & Associates

(57) ABSTRACT

An inverter that includes a first multiple-gate transistor including a source connected to a power supply, a drain connected to an output terminal, and a gate electrode; a second multiple-gate transistor including a source connected to a ground, a drain connected to the output terminal, and a gate electrode; and an input terminal connected to the gate electrodes of the first and second multiple-gate transistors. Each of the first and second multiple-gate transistors may further include a semiconductor fin formed vertically on an insulating layer on top of a substrate, a gate dielectric layer overlying the semiconductor fin, and a gate electrode wrapping around the semiconductor fin separating the source and drain regions.

50 Claims, 6 Drawing Sheets

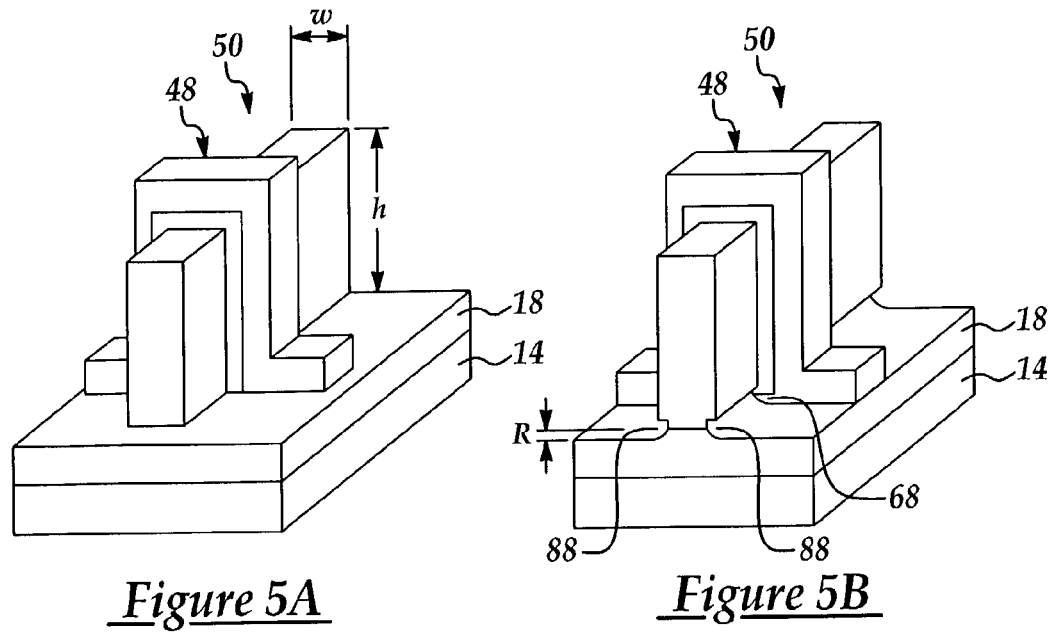
*Figure 5A*  *Figure 5B*
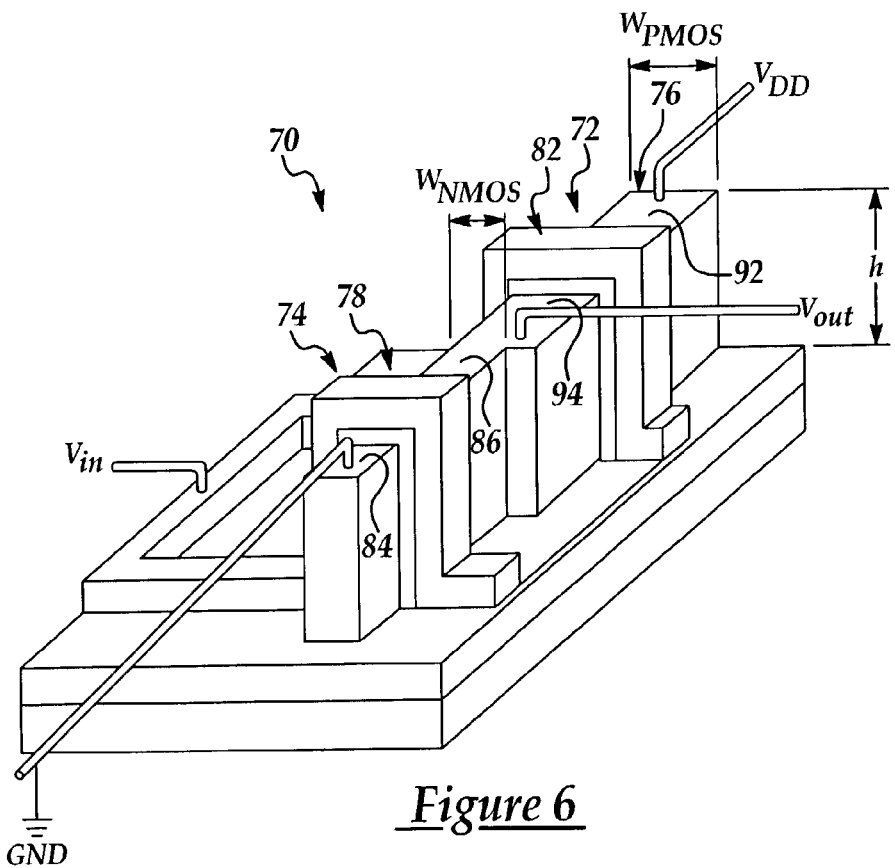
*Figure 6*

US 7,214,991 B2

CMOS INVERTERS CONFIGURED USING MULTIPLE-GATE TRANSISTORS

FIELD OF THE INVENTION

The present invention generally relates to the field of silicon-on-insulator (SOI) circuits, and more particularly, to an inverter formed of multiple-gate metal oxide semiconductor field effect transistors (MOSFETs).

BACKGROUND OF THE INVENTION

The dominant semiconductor technology used for the manufacture of ultra-large scale integrated (ULSI) circuits is the metal-oxide-semiconductor field effect transistor (MOSFET) technology. Reduction in the size of MOSFETs has provided continued improvement in speed performance, circuit density, and cost per unit function over the past few decades. As the gate length of the conventional bulk MOSFET is reduced, the source and drain increasing interact with the channel and gain influence on the channel potential. Consequently, a transistor with a short gate length suffers from problems related to the inability of the gate to substantially control the on and off states of the channel. Phenomena such as reduced gate control associated with transistors with short channel lengths are termed short-channel effects. Increased body doping concentration, reduced gate oxide thickness, and ultra-shallow source/drain (S/D) junctions are ways to suppress short-channel effects. However, for device scaling well into the sub-50 nm regime, the requirements for body-doping concentration, gate oxide thickness, and source/drain doping profiles become increasingly difficult to meet when conventional device structures, based on bulk silicon (Si) substrates, are employed. Innovations in front-end process technologies or the introduction of alternative device structures are required to sustain the historical pace of device scaling.

For device scaling well into the sub-30 nm regime, a promising approach to controlling short-channel effects is to use an alternative device structure with multiple-gate electrodes. Examples of multiple-gate structures include the double-gate structure, triple-gate structure, omega-FET structure, and the surround-gate or wrap-around gate structure. A multiple-gate transistor structure is expected to extend the scalability of CMOS technology beyond the limitations of the conventional bulk MOSFET and realize the ultimate limit of silicon MOSFETs. The introduction of additional gates improves the capacitance coupling between the gates and the channel, increases the control of the channel potential by the gate, helps suppress short channel effects, and prolongs the scalability of the MOS transistor.

A simple example of a multiple-gate device is the double-gate MOSFET structure, where there are two gate electrodes on the opposing sides of the channel or silicon body. A one way to fabricate a double-gate MOSFET is described by U.S. Pat. No. 6,413,802B1, issued to Hu et al, for FinFET transistor structures having a double gate channel extending vertically from a substrate and methods of manufacture. In U.S. Pat. No. 6,413,802B1, the device channel comprises a thin silicon fin formed on an insulative substrate (e.g. silicon oxide) and defined by using an etchant mask. Gate oxidation is performed, followed by gate deposition and gate patterning to form a double-gate structure overlying the sides of the fin. Both the source-to-drain direction and the gate-to-gate direction are in the plane of the substrate surface. The specific device structure, the cross-section of which is illustrated in FIG. 1A, is widely recognized to be one of the most manufacturable double-gate structures. A plane view of the double-gate structure 10 is shown in FIG. 1B. The etchant mask 12 of U.S. Pat. No. 6,413,802B1 is retained on the fin 20 in the channel region through the process. The device width of a single fin is defined to be twice the fin height h. Multiple device widths may be achieved on the same substrate 14 by placing multiple fins 22,24 in parallel, as illustrated in device 30 in FIG. 2. An inverter circuit may be formed using N-channel and P-channel MOSFETs comprising such multiple fins. In another embodiment of U.S. Pat. No. 6,413,802B1, an inverter circuit 40 is implemented using N-channel and P-channel MOSFETs 42,44 that are vertically aligned and separated by a dielectric layer 46, as illustrated in FIG. 3.

Another example of the multiple-gate transistor is the triple-gate transistor 50. The cross-section of the triple-gate transistor structure 50 is illustrated in FIG. 4A. The plane view of the triple-gate structure 50 is shown in FIG. 4C. The triple-gate transistor structure 50 has three gates: one gate on the top surface 52 of the silicone body/fin, and two gates on the sidewalls 54,56 of the silicon body/fin. The triple-gate device achieves better gate control than the double-gate device because it has one more gate on the top surface 52 of the silicon fin.

While there is some work on the design and fabrication of multiple-gate devices such as the double-gate and triple-gate devices, there is little work on circuits, such as inverter circuits, configured using such devices. The relentless pursuit of high-performance has pushed logic and circuit designers to utilize every delay and area optimization technique at their disposal. However, the optimization of circuits, such as inverter circuits, incorporating multiple-gate transistors has not been addressed. Traditionally, in logic synthesis, delay optimization techniques have heavily relied on gate sizing algorithms which vary drive strengths of gates to optimize circuit delay. Since the delay in CMOS logic circuits not only depends on the drive strengths of each stage, but also on the width ratio of the P-channel and N-channel devices (P/N width ratio), it is crucial to make available a simple method to provide optimal P/N width ratios for inverters incorporating multiple-gate transistors.

Referring back to FIGS. 1A and 1B, a double-gate MOSFET structure 10 is shown. FIG. 1A shows the cross-sectional view of the double-gate MOSFET 10 through its channel region where the semiconductor fin 20 forms the channel and a gate electrode 16 straddles over the semiconductor fin 20, forming two gates 26,28, one on each of the two sidewalls 36,38 of the semiconductor fin 20. The plane view of the double-gate MOSFET structure 10 is shown in FIG. 1B. The width of a double-gate MOSFET formed using a single semiconductor fin is two times the fin height h, that is, the width of the double-gate MOSFET is equal to 2h. Varying the fin width for the double-gate MOSFET has no effect on the device width. Multiple device widths may be achieved on the same substrate by placing multiple fins in parallel. FIG. 2A shows the cross-sectional view of two double-gate MOSFETs connected in parallel. The width of the resulting parallel connection of two double-gate MOSFETs 4h.

FIG. 4A shows the cross-sectional view of a triple-gate transistor 50 through the channel region. The triple-gate transistor is similar to the double-gate transistor except for the absence of the mask on the top surface 52 of the semiconductor fin 20. The gate dielectric 58 wraps around the semiconductor fin 20 on three sides, and the gate electrode 48 straddles over the fin 20. The gate electrode 48 forms three gates: a gate 62 on the top surface 52 of the semiconductor fin 20 and a gate 64,66 on each of the two sidewalls 54,56 of the fin. The device width of the triple-gate MOSFET 50 is given by the sum of the fin width and twice the fin height, e.g. (2h+w). Note that in this device structure, a variation of the fin width w changes the device width. The value of fin width w may be varied by altering the layout as schematically illustrated in FIG. 4C. A three-dimensional perspective of the triple-gate MOSFET 50 is shown in FIG. 5A.

Triple-gate transistors may have a recessed insulator layer for improved gate control, as illustrated in FIG. 4B. Such a structure is also known as the Omega field-effect transistor (FET), or simply omega-FET, since the gate electrode has an omega-shape in its cross-sectional view. The encroachment of the gate electrode under the semiconductor fin or body forms an omega-shaped gate structure. It closely resembles the gate-all-around (GAA) transistors for excellent scalability, and uses a manufacturable process similar to that of the double-gate or triple-gate transistor. The omega-FET has a top gate 62, two sidewall gates 64,66, and special gate extensions or encroachments 68 under the semiconductor body. The omega-FET is therefore a field effect transistor with a gate that almost wraps around the body. In fact, the longer the gate extension, e.g. the greater the extent of the encroachment E, the more the structure approaches or resembles the gate-all-around structure. A three-dimensional perspective of the triple-gate transistor 50 with recessed insulator, or omega-FET, is schematically illustrated in FIG. 5B. The encroachment of the gate electrode 48 under the silicon body helps to shield the channel from electric field lines from the drain and improves gate-to-channel controllability, thus alleviating the drain-induced barrier lowering effect and improving short-channel performance. The encroachment 68 of the gate electrode under the silicon body relies on an undercut 88 of the insulator layer 18 on the substrate 14, thus forming an undercut 88 in the substrate 14 at the base of the silicon body. It should be noted that the device width of the omega-FET is given by the sum of the fin width w, twice the fin height h, and twice the encroachment E. Therefore, the device width is given by (w+2h+2E). A variation of the fin width for the omega-FET changes the device width.

The plane view showing the triple-gate transistor of FIG. 4A, or the omega-FET of FIG. 4B, is shown in FIG. 4C. Both cross-sections in FIGS. 4A and 4B are drawn along line A–A'.

It is therefore an object of the present invention to provide an inverter formed of multiple-gate metal oxide semiconductor field effect transistors.

It is another object of the present invention to provide a method for fabricating an inverter by multiple-gate metal oxide semiconductor field effect transistors.

SUMMARY OF THE INVENTION

In accordance with the present invention, an inverter formed of multiple-gate metal oxide semiconductor field effect transistors and a method for such fabrication are provided.

In a preferred embodiment, an inverter is provided which includes a first multiple-gate transistor including a source connected to a power supply, a drain connected to an output terminal and a gate electrode; a second multiple-gate transistor including a source connected to a ground, a drain connected to the output terminal, and a gate electrode; and an input terminal connected to the gate electrodes of the first and second multiple-gate transistors.

In the present invention inverter, the first and second multiple-gate transistors may be triple-gate transistors, or may be omega field-effect transistors. Each of the first and second multiple-gate transistors may further include a substrate that has an insulating layer on top and source, drain regions formed therein; a semiconductor fin formed vertically on the substrate, the semiconductor fin has two fin sidewalls and a fin top; a gate dielectric layer overlying the semiconductor fin; and a gate electrode that wraps around the semiconductor fin separating the source and drain regions. The semiconductor fin may be formed of silicon, or may be formed of silicon and germanium. The semiconductor fin may have a non-uniform fin width. A first semiconductor fin width for the first multiple-gate transistor may be different from a second semiconductor fin width for the second multiple-gate transistor. The first multiple-gate transistor and the second multiple-gate transistor may be formed on the same semiconductor fin, or may be formed on different semiconductor fins.

In the present invention inverter, the insulating layer includes a dielectric material, or includes silicon oxide. The insulating layer may have a thickness between 20 Angstroms and 1000 Angstroms. The gate dielectric layer may include silicon oxide, or may include silicon oxynitride, or may include a high permittivity material selected from the group consisting of $La_2O_3$, $Al_2O_3$, $HfO_2$, HfON and $ZrO_2$. The gate dielectric layer may be formed of a high permittivity material that has a relative permittivity of at least 5. The gate dielectric layer may have a thickness between 3 Angstroms and 100 Angstroms, or may have a thickness on the fin sidewall different than a thickness on the fin top, or may have a thickness on the fin top smaller than a gate dielectric thickness on the fin sidewall, or may have a thickness on the fin top of the semiconductor fin less than 20 Angstroms. The gate electrode may be formed of poly-crystalline silicon, or may be formed of poly-crystalline silicon germanium, or may be formed of a metal. The source and drain regions of the first and second multiple-gate transistors may be strapped by a conductive material selected from the group consisting of metals and silicides. An electrical contact between the conductive material and the source and drain regions may be made on at least one of the fin sidewalls and fin top of the semiconductor fin.

The present invention is further directed to an inverter that includes a first plurality of P-channel multiple-gate transistors each including a source connected to a power supply, a drain connected to an output terminal, and a gate electrode; a second plurality of N-channel multiple-gate transistors each including a source connected to ground, a drain connected to the output terminal, and a gate electrode; and an input terminal connected to the gate electrodes of the first plurality of P-channel and the second plurality of N-channel multiple-gate transistors.

In the present invention inverter, the first plurality of P-channel and the second plurality of N-channel multiple-gate transistors may be triple-gate transistors, or may be omega field-effect transistors. Each of the first plurality of P-channel and the second plurality of N-channel multiple-gate transistors may include a substrate that has an insulating layer formed on a top surface; source and drain regions formed in the substrate; a semiconductor fin vertically formed on the insulating layer, the fin has a fin top and two fin sidewalls; a gate dielectric layer overlying the semiconductor fin; and a gate electrode wrapping around the semiconductor fin separating the source and drain regions. The semiconductor fin may include silicon, or may include silicon and germanium. The semiconductor fin may have a non-uniform fin width. A first fin width for the first plurality of P-channel multiple-gate transistors may be different from a second fin width for the second plurality of N-channel multiple-gate transistors. The first plurality of P-channel multiple-gate transistors and the second plurality of N-channel multiple-gate transistors may be formed on the same semiconductor fin, or may be formed on different semiconductor fins.

In the present invention inverter, the insulating layer may include a dielectric material, or may include a silicon oxide. The insulating layer may have a thickness between 20 Angstroms and 1000 Angstroms. The gate dielectric layer may include silicon oxide, or may include silicon oxynitride, or may include a high permittivity material selected from the group consisting of $La_2O_3$, $Al_2O_3$, $HfO_2$, HfON and $ZrO_2$. The gate dielectric layer may include a high permittivity material that has a relative permittivity of at least 5. The gate dielectric layer may have a thickness between 3 Angstroms and 100 Angstroms, or may have a different thickness on the fin sidewall than on the fin top, or may have a smaller thickness on the fin top than on the fin sidewall, or may have a thickness on the fin top of less than 20 Angstroms. The gate electrode may include poly-crystalline silicon, or poly-crystalline silicon germanium, or a metal. The source and drain regions may be strapped by a conductive material selected from the group consisting of metals and silicides. An electrical contact between the conductive material and the source and drain regions may be made on at least one of the fin sidewalls and fin top of the semiconductor fin.

The present invention is still further directed to a method for fabricating an inverter by multiple-gate transistors which can be carried out by the operating steps of providing a substrate that includes a semi-conducting layer overlying an insulating layer; forming a semiconductor fin in the semi-conducting layer, the fin has two sidewalls and a top; depositing a layer of a dielectric material overlying the semiconductor fin; depositing a layer of a conductive material overlying the layer of dielectric material; patterning the layer of conductive material forming gate electrode straddling across the two sidewalls and the top of the semiconductor fin; and forming a source and a drain region in the semiconducting layer.

In the method for fabricating an inverter by multiple-gate transistors, the semi-conducting layer may include silicon, or may include silicon and germanium. The insulating layer may include silicon oxide. The semiconductor fin forming process may further include a fin surface smoothing step. The surface smoothing step may further include sacrificial oxidation and high temperature annealing in a hydrogen ambient. The dielectric material layer may include silicon oxide, or may include silicon oxynitride, or may include a high permittivity material of $La_2O_3$, $Al_2O_3$, $HfO_2$, HfON or $ZrO_2$. The high permittivity material may have a relative permittivity of at least 5. The dielectric material layer may have a thickness between 3 Angstroms and 100 Angstroms, or may have a thickness on the fin sidewalls different than a thickness on the fin top, or may have a smaller thickness on the fin top compared to a thickness on the fin sidewall, or may have a thickness on the fin top of less than 20 Angstroms. The dielectric material may include poly-crystalline silicon, or poly-crystalline silicon germanium. The conductive material layer may be formed on the source region and the drain region. The conductive material layer may be selected from the group consisting of metals, metallic silicides and metallic nitrides.

BRIEF DESCRIPTION OF THE DRAWINGS

These and other objects, features and advantages of the present invention will become apparent from the following detailed description and the appended drawings in which:

FIGS. 5A and 5B are enlarged, perspective views for a present invention triple-gate transistor without and with recessed insulator, respectively.

FIG. 6 is an enlarged, perspective view of a present invention CMOS inverter formed by triple-gate N-channel and P-channel MOSFETs.

DETAILED DESCRIPTION OF THE PREFERRED AND ALTERNATE EMBODIMENTS

Figure 1A:
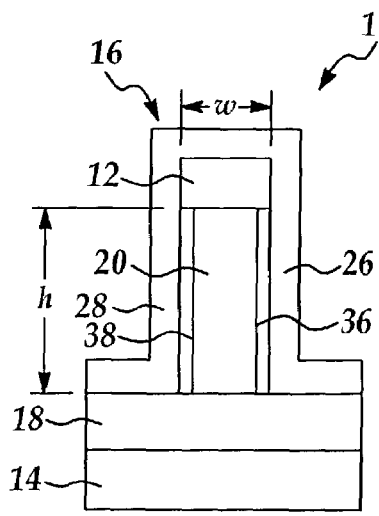
FIGS. 1A and 1B are enlarged, cross-sectional view and plane view, respectively, for a conventional double-gate device structure.
Figure 1B:
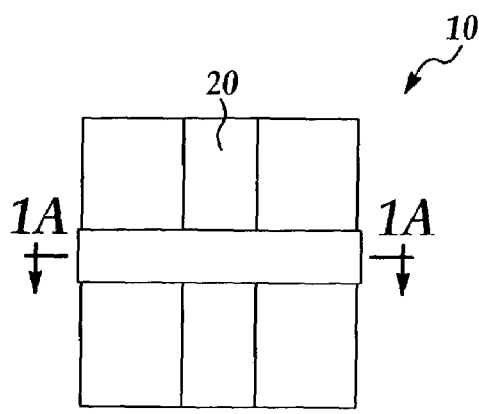
Figure 2A:
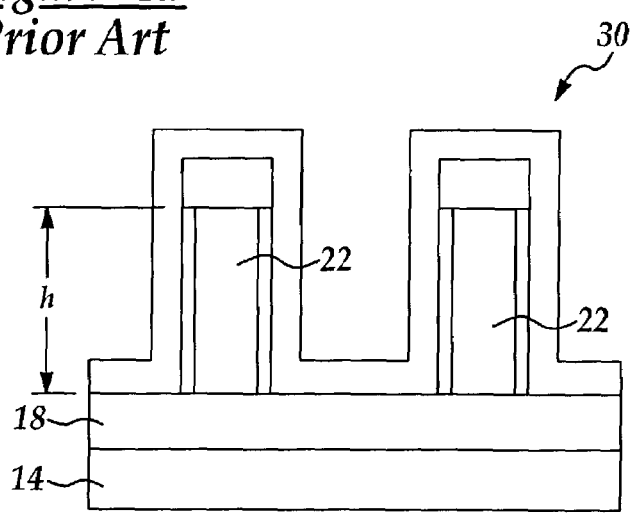
FIGS. 2A and 2B are enlarged, cross-sectional view and plane view, respectively, for two double-gate devices connected in parallel.
Figure 2B:
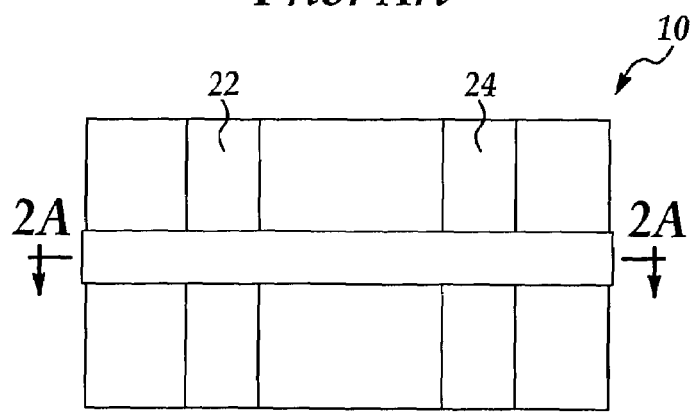

In accordance with the present invention, an inverter circuit may be formed using N-channel and P-channel MOSFETs comprising of a single fin or multiple fins. An inverter circuit comprises a complementary pair of transistors. The complementary pair includes a P-channel transistor and an N-channel transistor. The ratio of the width of the P-channel MOSFET to the width of the N-channel MOSFET is termed the P/N width ratio. It is advantageous to have the freedom of selecting an appropriate P/N width ratio to optimize circuit performance or circuit delay time. It should be noted that the double-gate MOSFET as shown in FIGS. 1 and 2 are not able to offer a continuous range of P/N width ratio if the P-channel and the N-channel MOSFETs have the same fin height, or are formed from the same semiconductor film. If two fins are used for the P-channel MOSFET and one fin is used for the N-channel MOSFET in an inverter circuit, the P/N width ratio is 2. If three fins are used for the P-channel MOSFET and two fins are used for the N-channel MOSFET in an inverter circuit, the P/N width ratio is 3/2 or 1.5. The P/N width ratio must be a number given by a quotient of two integers. It cannot be continuously varied. It is not straightforward to realize a P/N width ratio of 1.35 using the double-gate MOSFET as shown in FIGS. 1 and 2.

Figure 3:
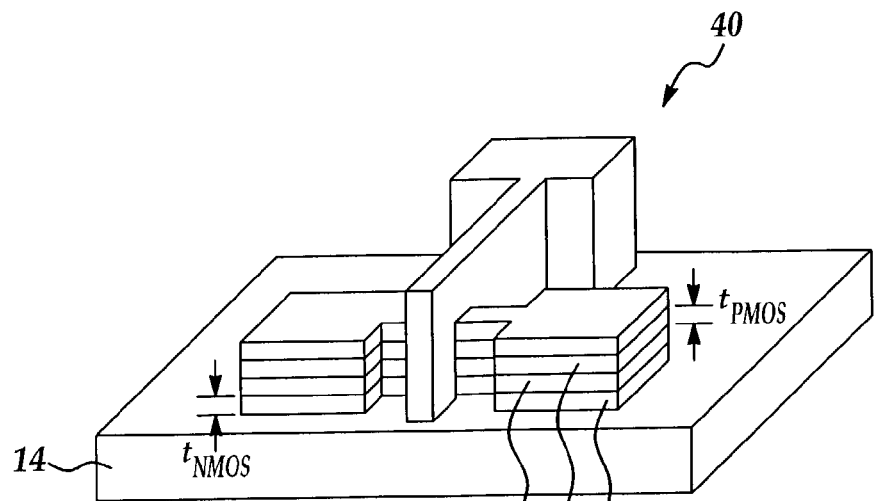
FIG. 3 is an enlarged, perspective view of a conventional CMOS inverter utilizing stacked P-channel and N-channel MOSFETs.

One way to vary the P/N ratio of the double-gate MOSFET continuously is to use a stacked structure comprising of P-channel and N-channel MOSFETs vertically aligned and separated by a dielectric layer, as shown in FIG. 3. This structure is described in U.S. Pat. No. 6,413,802B1. The PMOS layer has a thickness tPMOS and the NMOS layer has a thickness tNMOS. The ratio of the thickness of the PMOS layer to the NMOS layer, e.g. tPMOS/tNMOS, is the P/N width ratio and may be varied over a wide range. The stacked structure, as shown in FIG. 3, is not easily fabricated. It requires the formation of a crystalline PMOS layer overlying the dielectric layer, by methods such as solid phase epitaxy and lateral epitaxial overgrowth, which are expensive and have low throughput.

In the present invention, the problems of prior art are solved by configuring an inverter circuit using multiple-gate transistors with a gate on the top surface of the semiconductor fin. Multiple-gate transistors with a gate on the top surface of the semiconductor fin include the triple-gate MOSFET and the omega-FET.

Figure 4A:
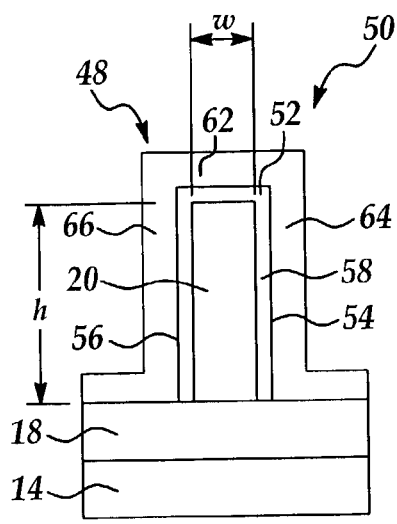
FIGS. 4A, 4B and 4C are enlarged, cross-sectional views and plane view, respectively, for a triple-gate device structure with recessed insulator.
Figure 4B:
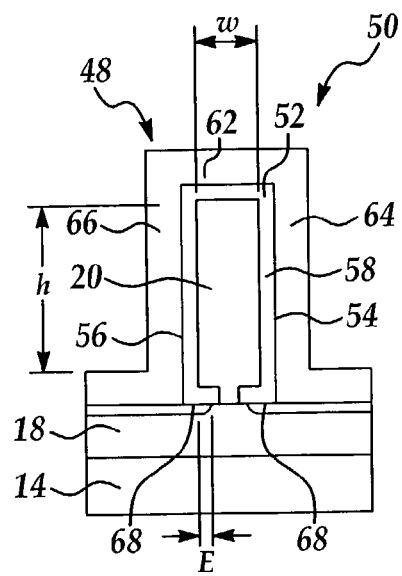
Figure 4C:
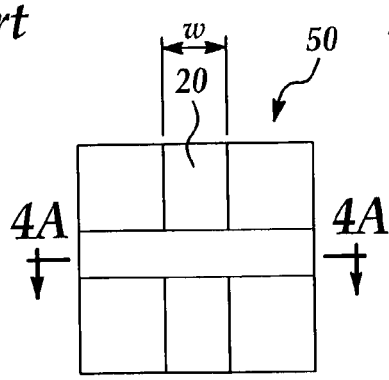

An inverter circuit incorporating multiple-gate transistors such as triple-gate MOSFET and omega-FET is provided in the present invention. In one embodiment of the present invention, the inverter circuit is provided with the triple-gate transistors of FIG. 4A. In another embodiment, the inverter circuit is provided with triple-gate transistors with a recessed insulator layer, also known as omega-FETs, of FIG. 4B. An illustration of the inverter structure 70 incorporating triple-gate transistors 72,74 are shown in FIG. 6. In FIG. 6, the inverter structure 70 is comprised of a single semiconductor fin 76. The semiconductor fin 76 constitutes the inverter which may have a non-uniform uniform width. The fin width is wNMOS in the portion where an N-channel channel MOSFET 74 is formed and wPMOS in the portion where a P-channel channel MOSFET 72 is formed. The fin height is h for both N-channel channel and P-channel MOSFETs 72,74 in the preferred embodiment. Nevertheless, the fin height does not have to be uniform, and can be different in different regions of the semiconductor 76. In the preferred embodiment, the semiconductor fin 76 is comprised of silicon. In general, the semiconductor fin 76 may be comprised of any elemental semiconductor such as germanium, any alloy semiconductor such as silicon-germanium, or any compound semiconductor such as indium phosphide and gallium arsenide.

The inverter structure 70 of FIG. 6 is formed from a complementary pair of transistors, an N-channel triple-gate transistor 74 comprising N-type source and drain regions 84,86 separated by a gate electrode 78, and a P-channel triple-gate transistor 72 comprising P-type source and drain regions 92,94 separated by a gate electrode 82. In the preferred embodiment, the gate electrode 78,82 is polycrystalline silicon (poly-Si) and is doped N-type in the N-channel MOSFET 74 and doped P-type in the P-channel MOSFET 72. In general, the gate electrodes 78,82 may be comprised of a material such as poly-crystalline silicon (poly-Si), poly-crystalline silicon-germanium (poly-SiGe), a refractory metal such as molybdenum and tungsten, compounds such as titanium nitride, or other conducting materials.

Figure 7:
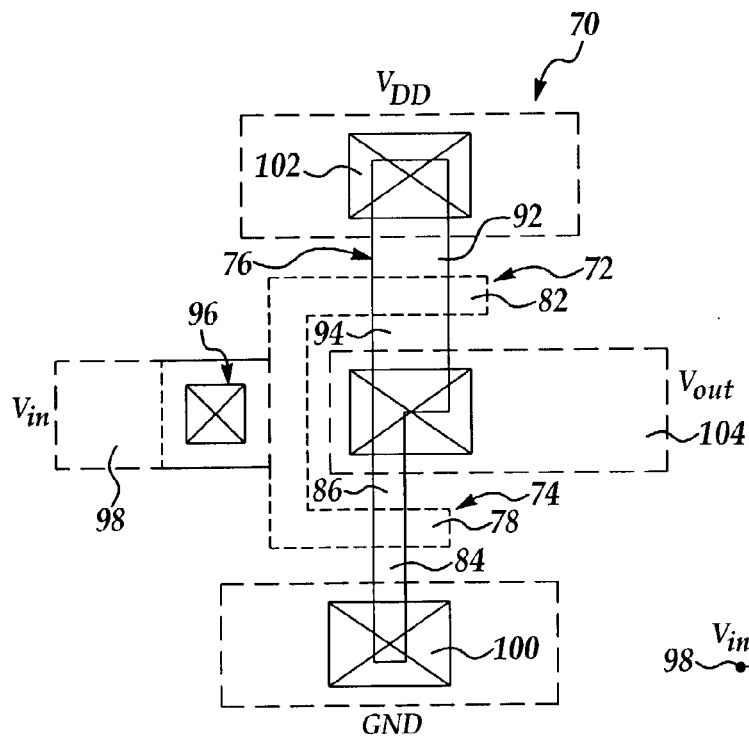
FIG. 7 is a layout diagram for the present invention CMOS inverter of FIG. 6.
Figure 8:
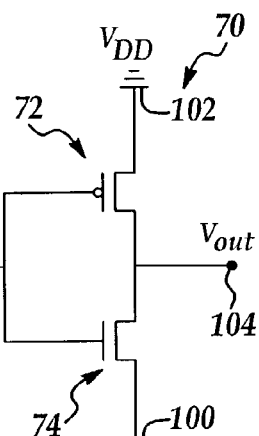
FIG. 8 is a schematic representation for a present invention inventor configured using multiple-gate transistors.
Figure 9A:
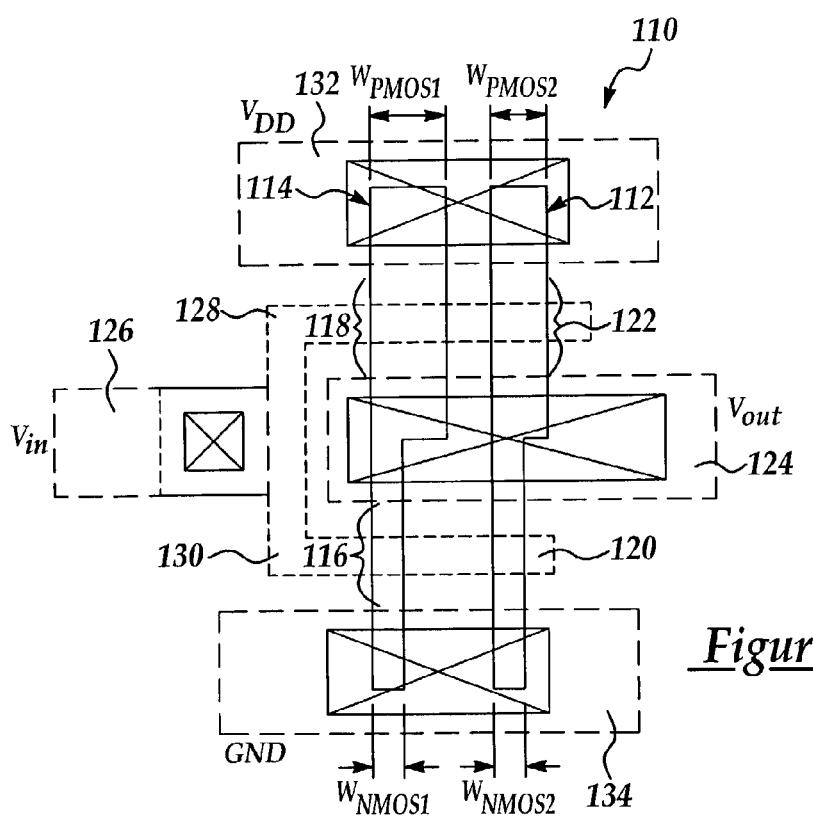
FIGS. 9A and 9B are layout diagrams for a present invnention CMOS inverter including triple-gate N-channel and P-channel MOSFETs with multiple fins.
Figure 9B:
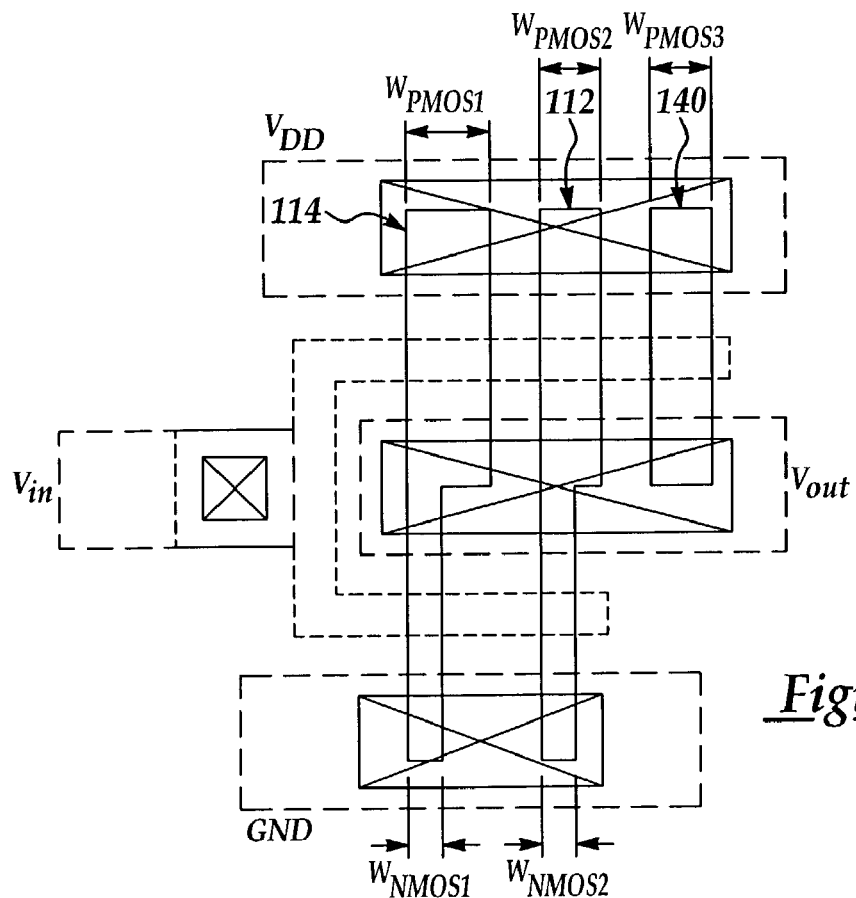

The layout of the inverter structure 70 of FIG. 6 is shown in FIG. 7. The gate electrodes 78,82 of the N-channel multiple-gate transistor 74 and the P-channel multiple-gate transistor 96 are connected together. The inverter also includes a gate contact 96. The gate contact 96 connects the gate electrode to a metal line 98, which provides an input to the inverter. Further, the inverter includes an electrical contact between the drain regions 86,94 of the N-channel and P-channel multiple-gate transistors 74,72 to provide an output for the inverter 70. The source 84 of the N-channel multiple-gate transistor 74 is connected to ground 100, and the source 92 of the P-channel multiple-gate transistor 72 is connected to the power supply 102. The circuit diagram for the inverter structure 70 of FIG. 6 is shown in FIG. 8.

The layout of the inverter structure 70 of FIG. 6 is shown in FIG. 7. The gate electrodes 78,82 of the N-channel multiple-gate transistor 74 and the P-channel multiple-gate transistor 72 are connected together, The inverter also includes a gate contact 96. the gate contact 96 connects the gate electrode to a metal line 98, which provides an input to the inverter. Further, the inverter includes an electrical contact between the drain regions 86,94 of the N-channel and P-channel multiple-gate transistors 74,72 to provide an output for the inverter 70. The source 84 of the N-channel multiple-gate transistor 74 is connected to ground 100, and the source 92 of the P-channel multiple-gate transistor 72 is connected to the power supply 102. The circuit diagram for the inverter structure 70 of FIG. 6 is shown in FIG. 8.

Figure 10:
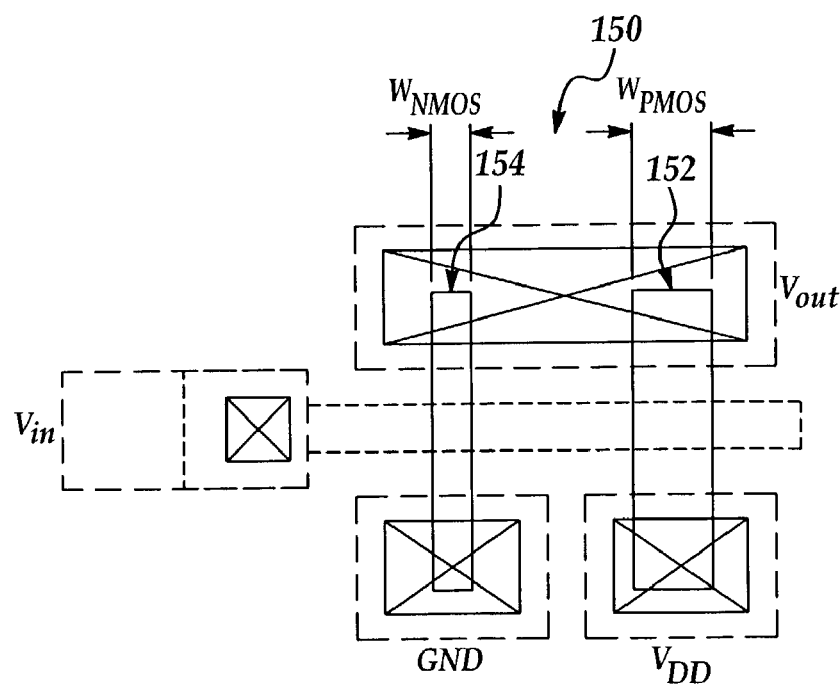
FIG. 10 is a layout diagram for a present invention CMOS inverter, in an alternate embodiment, formed by triple-gate N-channel and P-channel MOSFETs with multiple fins.

The N-type metal-oxide semiconductor (NMOS) and P-type metal-oxide-semiconductor (PMOS) devices need not be on the same semiconductor fin. In FIG. 10, structure 150 of yet another embodiment of the invention where the N-channel multiple-gate transistor and the P-channel multiple-gate transistor are formed using different semiconductor fins 152,154 with different fin widths.

The preceding explanation details the structural description of the inverter configured using multiple-gate transistors. Various variations of this invention may be implemented. As an illustration, semiconductor fin with non-uniform width may comprise of a plurality of multiple-gate transistors of the same type, e.g. two P-channel transistors.

A method for the formation of the present invention structure is now described by a process flow for fabricating a triple-gate transistor or an omega-FET.

Figure 11A:
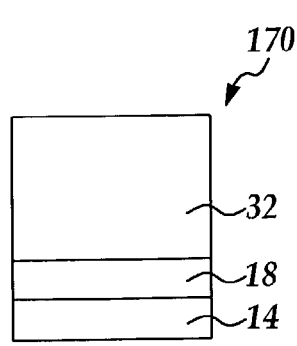
FIGS. 11A, 11B, 11C and 11D are enlarged, cross-sectional views illustrating the present invention process flow for the formation of a triple-gate transistor.
Figure 13:
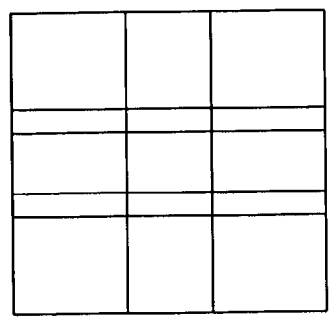
FIG. 13 is an enlarged, plane view of a completed present invention triple-gate transistor or omega-FET.

The fabrication process for the triple-gate transistor, the preferred embodiment of his invention, is schematically described in FIGS. 11A–11D. FIGS. 11A–11D show the device cross-sections at the various process steps, as observed along line A-A' of the plane view of the completed device 170 shown in FIG. 13. The starting substrate 14 is a silicon-on-insulator substrate, as shown in FIG. 11A. The starting substrate comprises a silicon film 32 overlying an insulator layer 18. The insulator layer 18 has a thickness of between 20 Angstroms and 1000 Angstroms. The first insulator layer 18 can be made of any dielectric material such as silicon oxide. In the preferred embodiment, the first dielectric material is silicon oxide.

Figure 11B:
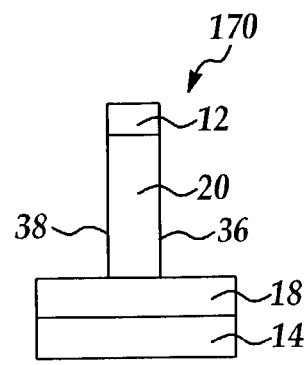
Figure 11C:
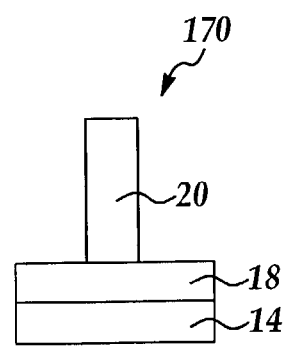
Figure 11D:
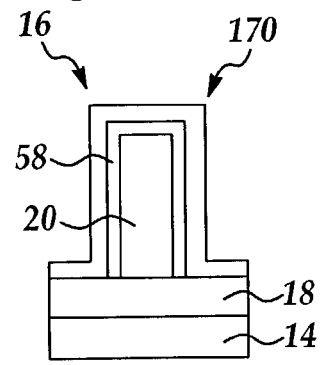

The silicon fins 20 are patterned using an etchant mask 12, as shown in FIG. 11B. The etchant mask may comprise a material commonly used for masking an etch process, such as photoresist, silicon oxide, silicon nitride, etc. In the preferred embodiment, the etchant mask is silicon oxide. In the present invention, an optional fin surface smoothing step is used to improve or reduce the surface roughness of the fin sidewalls 36,38. If the etchant mask used for fin definition is silicon oxide, as in the preferred embodiment, it may be removed before or after the fin smoothing process. The removal of the etchant mask 12 on the silicon fin 20 prior to gate dielectric formation allows the device to have a triple-gate structure since the gate electrode 16 will finally be formed on each of the two sidewalls 36,38 as well as the top surface of the fin, as shown in FIG. 11C. If the etchant mask 12 used for fin definition is a photoresist, it has to be removed before the fin surface smoothing step to avoid the high temperatures used in the fin smoothing process. The fin surface smoothing is performed by subjecting the fin 20 to a sacrificial oxidation and/or silicon sidewall treatment (e.g. high temperature anneal at 1000° C. in $H_2$ ambient). The surface smoothing of the fin sidewalls contributes to the achievement of good carrier mobilities. Depending on whether the silicon oxide etchant mask is removed prior to the fin smoothing process step, the shape of the fin may be square-like or rounded at the top. If the etchant mask may be retained on the fin throughout the process, the final device structure will be a double-gate device structure.

The process is followed by gate dielectric formation. The gate dielectric may be formed by thermal oxidation, chemical vapor deposition, sputtering, etc. In general, the thickness of the gate dielectric may be different on the sidewall of the fin and on the top of the fin. Depending on the technique of gate dielectric formation, the gate dielectric thickness on the top of the fin may be thinner than the thickness on the fin sidewall. In one embodiment, the gate dielectric thickness on the top surface of the fin is less than 20 Angstroms. The gate dielectric may comprise a conventional material such as silicon dioxide or silicon oxynitride with a thickness ranging from 3 Angstroms to 100 Angstroms, and more preferably, from about 10 Angstroms or less. The gate dielectric may also comprise high permittivity (high-k) materials such as lanthanum oxide ($La_2O_3$), aluminum oxide ($Al_2O_3$) hafnium oxide ($HfO_2$), hafnium oxynitride (HfON), or zirconium oxide ($ZrO_2$), with an equivalent oxide thickness of 3 Angstroms to 100 Angstroms.

In the next step, the gate material is deposited. The gate material may be polycrystalline-silicon (poly-Si), poly-crystalline silicon-germanium (poly-SiGe), a refractory metal such as molybdenum and tungsten, compounds such as titanium nitride, or other conducting materials. A gate mask is defined and the underlying gate material is etched to form the gate electrode. The gate etch stops on the gate dielectric, and the gate is electrically isolated from the transistor structure by the gate dielectric. In the preferred embodiment, the gate material is poly-Si and the gate dielectric is silicon oxynitride. A plasma etch using chlorine and bromine chemistry may be used to achieve a high etch selectivity. A high etch selectivity is critical for device structures with a tall fin and aggressively scaled gate dielectric thickness.

After the definition of the gate, the gate mask can be removed. At this stage of the device fabrication, the three-dimensional perspective of the device is similar to that shown in FIG. 5 (spacers and source/drain extensions are not shown). The lightly-doped drain (LDD) or drain extension is formed next. This may be achieved by ion implantation, plasma immersion ion implantation (PIII), or other techniques known and used in the art. Next, a spacer is formed on the sidewalls of the gate by techniques known and used in the art, e.g. deposition and selective etching of the spacer material. The spacer material may be comprised of a dielectric material such as silicon nitride or silicon dioxide. In the preferred embodiment, the spacer comprises a silicon nitride and an oxide composite spacer. After spacer formation, source and drain regions are doped by ion implantation, PIII, gas or solid source diffusion, or any other techniques known and used in the art. Any implant damage or amorphization can be annealed through subsequent exposure to elevated temperatures. The resistance of the source, drain, and gate can also be reduced by strapping the source, drain, and gate with a conductive material. The conductive material may be a metallic silicide such as titanium silicide, cobalt silicide or nickel silicide, a metallic nitride such as titanium nitride and tantalum nitride, a metal such as tungsten and copper, or a heavily doped semiconductor such as n+ doped Si. In the preferred embodiment, the conductive material is nickel silicide which may be formed by a self-aligned silicide (salicide) process. In the source and drain regions, the conductive material may be formed on both the top of the fin as well as on the sidewall of the fin.

Contacts are then formed to the source, drain, and gate regions using techniques known and used in the art. It is important to achieve a very low contact resistance in nanoscale devices. This completes the fabrication of the triple-gate transistor.

Figure 12A:
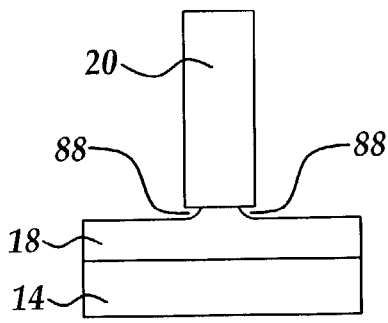
FIGS. 12A and 12B are enlarged, cross-sectional views illustrating the present invention process flow for the formation of omega-FET.
Figure 12B:
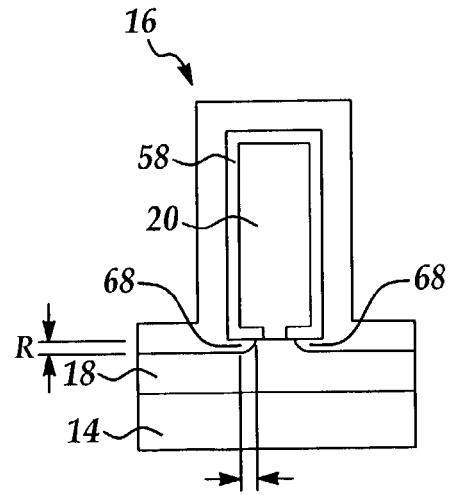

The fabrication process for the omega-FET is similar to that of the triple-gate transistor. The fabrication of the omega-FET adopts the same process as the triple-gate transistor up to the fin formation step, as shown in FIG. 11C. Following FIG. 1C, a recess in the insulator layer is formed and generally involves an etch process. FIGS. 12A and 12B show the cross-sections of the device after the recess is formed. An example of an etch process is a wet etch using dilute hydrofluoric acid (HF) (formed by a mixture of 25 parts water and 1 part concentrated HF) for 30–600 seconds at 25° C. to etch about 50–1000 Angstroms of thermally grown silicon oxide. In the preferred embodiment, the recess R is between 20 Angstroms and 500 Angstroms. After the formation of the recess, subsequent processes such as gate dielectric formation, gate electrode formation, and contact formation are exactly the same as that described for the triple-gate transistor.

The fabrication process for the omega-FET is similar to that of the triplegate transistor. The fabrication of the omega-FET adopts the same process as the triple-gate transistor up to the fin formation step, as shown in FIG. 11C. Following FIG. 11C, as shown in FIG. 12A, a recess in the insulator layer is formed and generally involves an etch process. FIGS. 12A and 12B show the cross-sections of the device after the recess is formed. An example of an etch process is a wet etch using dilute hydrofluoric acid (HF) (formed by a mixture of 25 parts water and 1 part concentrated HF) for 30–600 seconds at 25° C. to etch about 50–1000 Angstroms of thermally grown silicon oxide. In the preferred embodiment, the recess R is between 20 Angstroms and 500 Angstroms. After the formation of the recess, subsequent processes such as gate dielectric formation, gate electrode formation, and contact formation are exactly the same as that described for the triple-gate transistor.

Furthermore, while the present invention has been described in terms of a preferred and alternate embodiments, it is to be appreciated that those skilled in the art will readily apply these teachings to other possible variations of the inventions.

The embodiment of the invention in which an exclusive property or privilege is claimed are defined as follows.

What is claimed is:

1. An inverter comprising:
   a first multiple-gate transistor comprising a first semiconductor fin width comprises a source connected to a power supply, a drain connected to an output terminal, and a gate electrode;
   a second multiple-gate transistor comprising a second semiconductor fin width comprises a source connected to a ground, a drain connected to said output terminal, and a gate electrode;

wherein said first and second multiple-gate transistors are triple-gate transistors and said first and second semiconductor fin widths are different from one another; and an input terminal connected to said gate electrodes of said first and second multiple-gate transistors.

2. The inverter of claim 1, wherein said first and second multiple-gate transistors are omega field-effect transistors.

3. The inverter of claim 1, wherein each of said first and second multiple-gate transistors further. comprises:
   a substrate having an insulating layer on top and source, drain regions formed therein;
   a semiconductor fin formed vertically on said substrate, said semiconductor fin having two fin sidewalls and a fin top comprising one of said first and second semiconductor fin widths;
   a gate dielectric layer overlying said semiconductor fin; and
   a gate electrode wraps around said semiconductor fin separating said source and drain regions.

4. The inverter of claim 3, wherein said semiconductor fin comprises silicon.

5. The inverter of claim 3, wherein said semiconductor fin comprises silicon and germanium.

6. The inverter of claim 3, wherein said semiconductor fin has a non-uniform fin width in a direction parallel to said substrate to form said first and second semiconductor fin widths.

7. The inverter of claim 3, wherein said insulating layer comprises a dielectric.

8. The inverter of claim 3, wherein said insulating layer comprises silicon oxide.

9. The inverter of claim 3, wherein said insulating layer having a thickness between 20 Angstroms and 1000 Angstroms.

10. The inverter of claim 3, wherein said gate dielectric layer comprises silicon oxide.

11. The inverter of claim 3, wherein said gate dielectric layer comprises silicon oxynitride.

12. The inverter of claim 3, wherein said gate dielectric layer comprises a high permittivity material selected. from the group consisting of $La_2O_3$, $Al_2O_3$, $HfO_2$, HFON and $ZrO_2$.

13. The inverter of claim 3, wherein said gate dielectric layer comprises a high permittivity material having a relative permittivity of at least 5.

14. The inverter of claim 3, wherein said gate dielectric layer having a thickness between 3 Angstroms and 100 Angstroms.

15. The inverter of claim 3, wherein said gate dielectric layer having a thickness on said fin sidewall different than a thickness on said fin top.

16. The inverter of claim 3, wherein said gate dielectric layer having a thickness on said tin top smaller than a gate dielectric thickness on said fin sidewall.

17. The inverter of claim 3, wherein said gate dielectric layer having a thickness on said fin top of the semiconductor fin less than 20 Angstroms.

18. The inverter of claim 3, wherein said gate electrode comprises poly-crystalline silicon.

19. The inverter of claim 3, wherein said gate electrode comprises polycrystalline silicon germanium.

20. The inverter of claim 3, wherein said gate electrode comprises a metal.

21. The inverter off claim 3, wherein said source and drain regions are strapped by a conductive material selected from the group consisting of metals and silicides.

22. The inverter of claim 21, wherein electrical contact between said conductive material and said source and drain regions are made on at least one of the fin sidewalls and fin top of the semiconductor fin.

23. The inverter of claim 1, wherein said first multiple-gate transistor and said second multiple-gate transistor are formed on the same semiconductor fin.

24. The inverter of claim 1, wherein said first multiple-gate transistor and said second multiple-gate transistor are formed on different semiconductor fins.

25. An inverter comprising:
   a first plurality of P-channel multiple-gate transistors each comprises a source connected to a power supply, a drain connected to an output terminal, and a gate electrode;
   a second plurality of N-channel multiple-gate transistors each comprises a source connected to ground, a drain connected to said output terminal, and a gate electrode;
   wherein said first plurality of P-channel transistors and said second plurality of N-channel multiple-gate transistors are triple-gate transistors respectively having different semiconductor fin widths; and
   an input terminal connected to the gate electrodes of said first plurality of P-channel and second plurality of N-channel multiple-gate transistors.

26. The inverter of claim 25, wherein said first plurality of P-channel and said second plurality of N-channel multiple-gate transistors are omega field-effect transistors.

27. The inverter of claim 25, wherein each of said first plurality of P-channel and said second plurality of N-channel multiple-gate transistors comprises:
   a substrate having an insulating layer formed on a top surface;
   source and drain regions formed in said substrate;
   a semiconductor fin vertically formed on said insulating layer, said fin having a fin top comprising said semiconductor fin width and two fin sidewalls;
   a gate dielectric layer overlying said semiconductor fin; and
   a gate electrode wrapping around said semiconductor fin separating said source and drain regions.

28. The inverter of claim 27, wherein said semiconductor fin comprises silicon.

29. The inverter of claim 27, wherein said semiconductor fin comprises silicon and germanium.

30. The inverter of claim 27, wherein said semiconductor fin having a non-uniform fin width in a direction parallel to said substrate.

31. The inverter of claim 27, wherein said insulating layer comprises a dielectric material.

32. The inverter of claim 27, wherein said insulating layer comprises silicon oxide.

33. The inverter of claim 27, wherein said insulating layer having a thickness between 20 Angstroms and 1000 Angstroms.

34. The inverter of claim 27, wherein said gate dielectric layer comprises silicon oxide.

35. The inverter of claim 27, wherein said gate dielectric layer comprises silicon oxynitride.

36. The inverter of claim 27, wherein said gate dielectric layer comprises a high permittivity material selected from the group consisting of $La_2O_3$, $Al_2O_3$, $HfO_2$, HfON and $ZrO_2$.

37. The inverter of claim 27, wherein said gate dielectric layer comprises a high permittivity material having a relative permittivity of at least 5.

38. The inverter of claim 27, wherein said gate dielectric layer having a thickness between 3 Angstroms and 100 Angstroms.

39. The inverter of claim 27, wherein said gate dielectric layer having a different thickness on said fin sidewall than on said fin top.

40. The inverter of claim 27, wherein said gate dielectric layer having a smaller thickness on said fin top than on said tin sidewall.

41. The inverter of claim 27, wherein said gate dielectric layer having a thickness on said fin top less than 20 Angstroms.

42. The inverter of claim 27, wherein said gate electrode comprises polycrystalline silicon.

43. The inverter of claim 27, wherein said gate electrode comprises polycrystalline silicon germanium.

44. The inverter of claim 27, wherein said gate electrode comprises a metal.

45. The inverter of claim 27, wherein said source and drain regions are strapped by a conductive material selected from the group consisting of metals and silicides.

46. The inverter of claim 45, wherein electrical contact between said conductive material and said source and drain regions is made on at least one of the fin sidewalls and fin top of the semiconductor fin.

47. The inverter of claim 25, wherein said first plurality of P-channel multiple-gate transistors and said second plurality of N-channel multiple-gate transistors are formed on the same semiconductor fin.

48. The inverter of claim 25, wherein said first plurality of Pchannel multiple-gate transistors and said second plurality of N-channel multiple-gate transistors are formed on different semiconductor fins.

49. An inverter comprising:
a first plurality of P-channel multiple-gate transistors each comprises a source connected to a power supply, a drain connected to an output terminal, and a gate electrode;
a second plurality of N-channel multiple-gate transistors each comprises a source connected to ground, a drain connected to said output terminal, and a gate electrode;
wherein said first plurality of P-channel and said second plurality of N-channel multiple-gate transistors are triple-gate transistors; and
wherein said first plurality at P-channel and said second plurality of N-channel multiple. gate transistors each comprise at least one fin formed vertically on a substrate, said at least one fin comprising said first plurality of P-channel multiple-gate transistors has a fin width that is different that a tin width of said at least one fin comprising said second plurality of N-channel multiple-gate transistors; and
an input terminal connected to the gate electrodes of said first plurality of P-channel and second plurality of N-channel multiple-gate transistors.

50. An inverter comprising:
a first plurality of P-channel multiple-gate transistors each comprises a source connected to a power supply, a drain connected to an output terminal, and a gate electrode;
a second plurality of N-channel multiple-gate transistors each comprises a source connected to ground, a drain connected to said output terminal, and a gate electrode;
wherein said first plurality of P-channel and said second plurality of N-channel multiple-gate transistors are triple-gate transistors respectively comprising different semiconductor fin widths; and
wherein said first plurality at P-channel and said second plurality of N-channel multiple gate transistors each comprise at least one fin formed vertically on a substrate, said at least one fin comprising said first plurality of P-channel multiple-gate transistors has a first number of multiple-gate transistors different than a second number of multiple-gate transistors of said at least one fin comprising said second plurality of N-channel multiple-gate transistors; and
an input terminal connected to the gate electrodes of said first plurality of P-channel and second plurality of N-channel multiple-gate transistors.

* * * * *